United States Patent [19]

Feldman et al.

[11] 4,292,609

[45] Sep. 29, 1981

[54] RECURSIVE FILTER FOR TRANSFER OF CHARGE DEPOSITS

[76] Inventors: Michel Feldman, 45, rue Saint Lambert, 75015 Paris; Jeannine Le Goff épouse Henaff, 3, ter Place Marquis, 92140 Clamart, both of France

[21] Appl. No.: 48,155

[22] Filed: Jun. 13, 1979

[30] Foreign Application Priority Data

Jun. 26, 1978 [FR] France ............................ 78 19829
Feb. 21, 1979 [FR] France ............................ 79 05108

[51] Int. Cl.³ .................... H03H 15/02; H03H 17/04; G11C 19/14
[52] U.S. Cl. ............................... 333/165; 307/221 D; 333/166
[58] Field of Search ............................ 333/165, 166; 307/221 D; 328/167; 357/24

[56] References Cited

U.S. PATENT DOCUMENTS

| 3,819,958 | 6/1974 | Gosney | 357/24 X |
| 4,118,795 | 10/1978 | Frye et al. | 357/24 X |
| 4,158,209 | 6/1979 | Levine | 357/24 |

FOREIGN PATENT DOCUMENTS 2534319  2/1977  Fed. Rep. of Germany .
2608582  9/1977  Fed. Rep. of Germany .
2378402  8/1978  France .

Primary Examiner—Marvin L. Nussbaum
Attorney, Agent, or Firm—Laff, Whitesel & Rockman

[57] ABSTRACT

A CTD recursive filter includes a single channel with two side-by-side CTD delay lines wherein charges are transferred in opposite directions. Each electrode of the first delay line forms a pair with a corresponding electrode of the second delay line. Each even pair of electrodes are separated from the next odd pair of electrodes by an even bridge electrode occupying the entire width of the channel. Each odd pair of electrodes are separated from the next even pair of electrodes by an odd bridge electrode also occupying the entire width of the channel. An electrode of the first line in an even pair and the electrode of the second line in the next odd pair have lengths the sum of which is a constant. An electrode of the first line in an odd pair and the electrode of the second line in the next even pair have lengths, the sum of which is equal to the constant. At each odd clock pulse, the odd bridge electrode charges are distributed to the closer even bridge electrodes. At each even clock pulse, the even bridge electrode charges are distributed to the closer odd bridge electrodes. Each delay line is connected from an input for a signal to be filtered and to an output for the filtered signal.

32 Claims, 22 Drawing Figures

CHARGE TRANSFERS IN FIG. 2

RECURSIVE FILTER

RECURSIVE FILTER

CHARGE TRANSFERS IN FIG.5

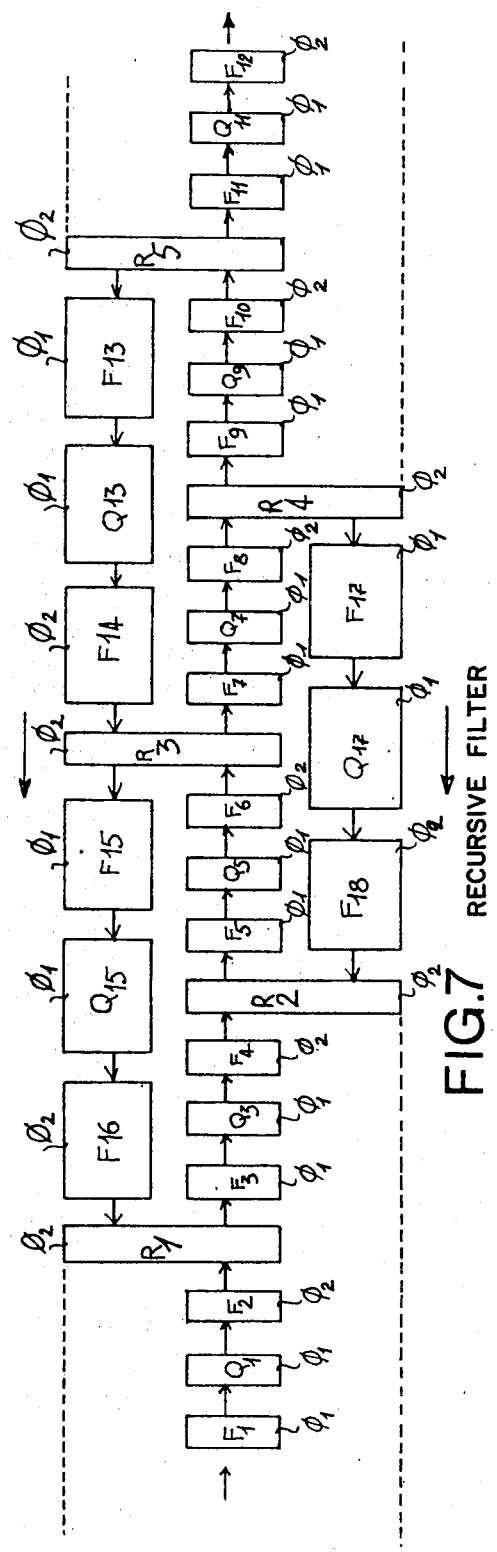
FIG.7 RECURSIVE FILTER
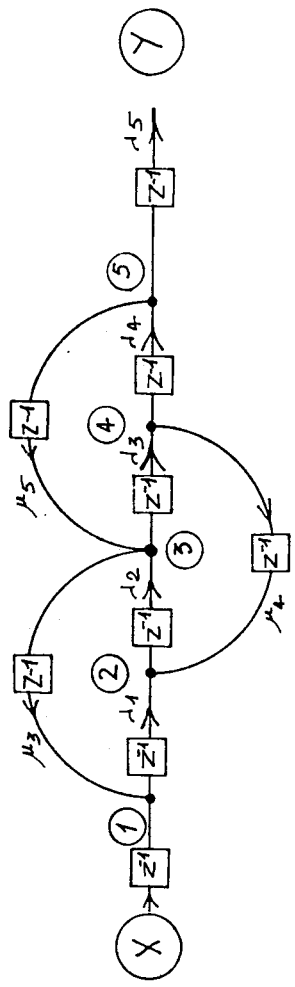
FIG.8 OPERATION OF RECURSIVE FILTER OF FIG.7

OPERATION OF THE FILTER OF FIG. 9

RECURSIVE FILTER

OPERATION OF THE FILTER OF FIG.11

CROSS SECTION OF FIG 11 FILTER

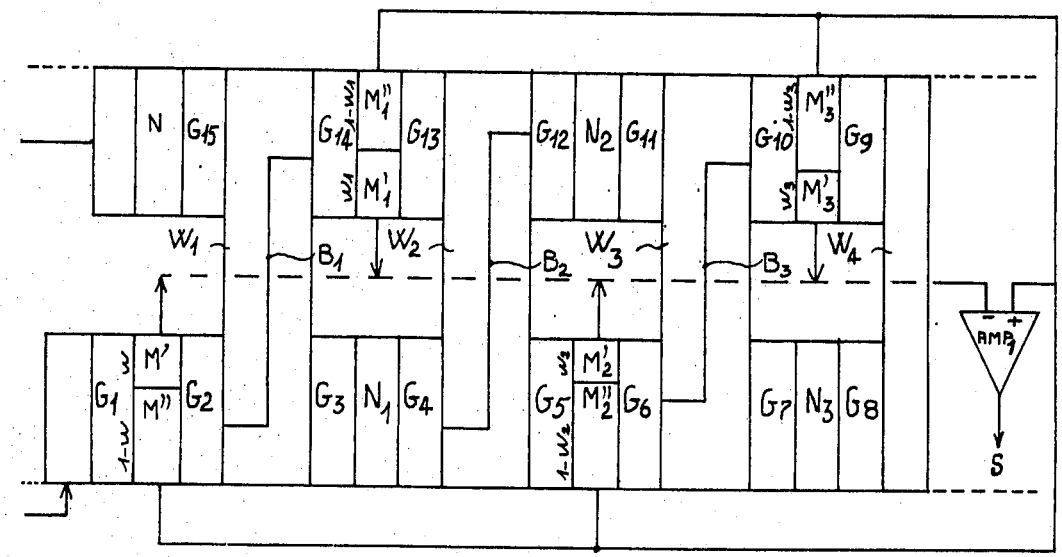
FIG.14  RECURSIVE FILTER
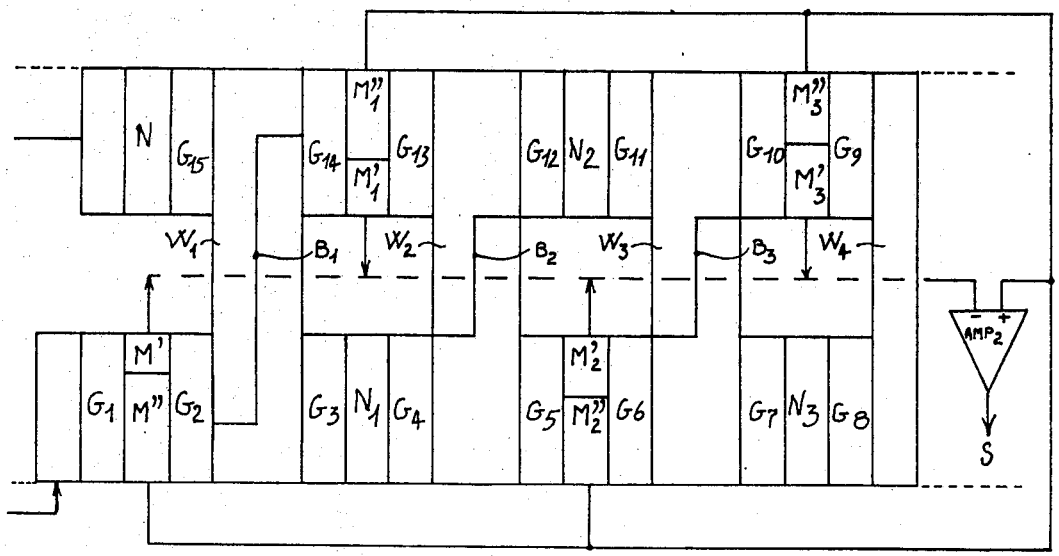
FIG.16  RECURSIVE FILTER HAVING POLES OF FIG.15

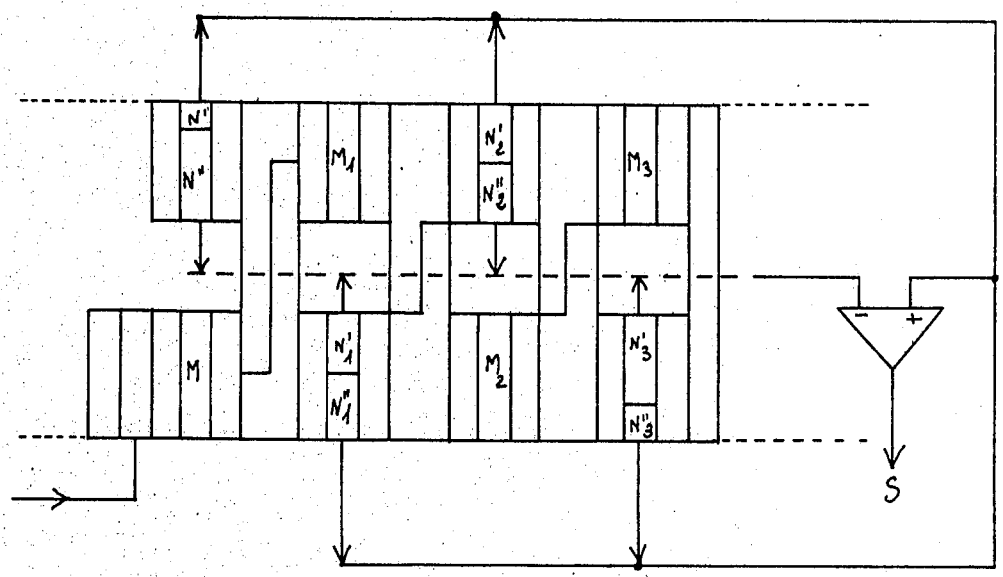
FILTER COMPLEMENTARY TO FILTER OF FIG.16
FIG.17
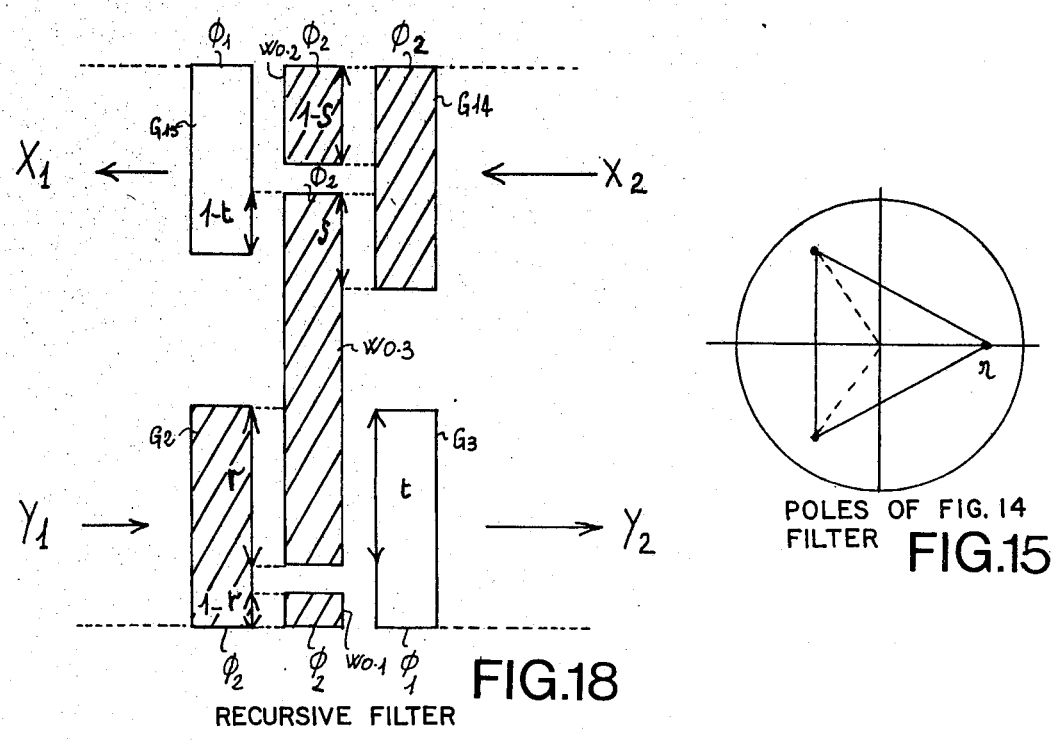
FIG.18 RECURSIVE FILTER
POLES OF FIG.14 FILTER FIG.15

RECURSIVE FILTER FOR TRANSFER OF CHARGE DEPOSITS

The present invention relates to recursive filters using charge transfer devices.

Charge transfer devices are microelectronic components using MOS (metal-oxide-silicon) capacitors for moving electric charges at the frequency of a clock, on the one hand, within the semiconductor device (either N or P type minority charges) and, on the other hand, on the other face of the capacitor electrode (opposite sign image charges). By way of illustration regarding charge transfer devices, reference may be made to the American technical book entitled "Charge Transfer Devices" by C. H. Séquin and M. F. Tompsett, and published by Academic Press, Inc., 1975.

Charge transfer devices (or in short "CTD") basically implement delay lines for analog samples and provide time delays which can be accurately controlled, independently of the frequency of the sampled signals. Thus, they make it possible to implement either most usual non-recursive electronic filters, or recursive filters with CTD's connected via external loops.

The most usual non-recursive CTD filters are split electrode transversal filters. Image charges corresponding to an operation step of the device are shared in two portions in which the sum is constant, but the difference is measured. In pages 216-232 of the previously mentioned technical book, a chapter is devoted to such CTD transversal filters. The technology used for those filters, employing two bus bars is now satisfactorily controllable.

Indeed, the known CTD recursive filters utilize CTD's only as a delay line with external feedback and feedforward loops. In pages 209-216 of the previously mentioned technical book, a chapter is devoted to those recursive filters. Good operation of those filters basically depends on backward and forward loop gain stabilities. Use of microelectronics makes that problem extremely difficult, or even impossible, to overcome.

Other devices have been described as several side by side arranged CTD delay lines, together with a logic circuitry that selectively controls the periodic charge retention in some of them. Those devices allow only very poor filtering.

A purpose of the present invention is to provide CTD recursive filters of a type that avoids the above mentioned drawbacks and is manufacturable by using techniques that have been experienced in manufacturing CTD transversal filters.

According to a feature of the present invention, a CTD recursive filter includes within a single channel, two side by side CTD delay lines wherein charges are respectively transferred in opposite directions. Each electrode of the first CTD delay line constitutes a pair with a corresponding electrode of the second delay line. Each even pair of electrodes is separated from the next odd pair of electrodes by an even bridge electrode occupying the entire width of the channel. Each odd pair of electrodes is separated from the next even pair of electrodes by an odd bridge electrode, also occupying the entire width of the channel. An electrode of the first line in an even pair and the electrode of the second line in the next odd pair have lengths, the sum of which is a constant, when the even pair is separated from the concerned odd pair by an even bridge electrode. An electrode of the first line in an odd pair and the electrode of the second line in the next even pair have lengths, the sum of which is equal to the said constant, when the odd pair is separated from the even pair by an odd bridge electrode. At each odd clock pulse, the odd bridge electrode charges are distributed to the closer even bridge electrodes in accordance with the length of the electrode of the first line in the close even pair and the length of the electrode of the second line in the close odd pair. At each even clock pulse, the even bridge electrode charges are distributed to the closer odd bridge electrodes in accordance with the length of the electrode of the first line in the close odd pair and the length of the electrode of the second line in the close even pair, each delay line being connected from an input for a signal to be filtered and to an ouptut for the filtered signal.

The above mentioned arrangement of filters is very interesting as far as it proves that charges can be moved in opposite directions within the two side by side delay lines which are provided in a CTD device signal channel, while place to place charge exchanges are provided between them.

At each clock pulse, when an exchange bridge electrode is switched on between the two bidirectional lines the exchange bridge electrode pumps the charges which are available at its two input electrodes before it releases all the pumped charges to its output electrodes. The release is made in predetermined portions. As it will appear in the following, such an arrangement is only a very particular example of a more general arrangement according to this invention. As a matter of fact, in that particular arrangement, the charge transfer along a line implies a compulsory travel of the charge through the bridge electrodes located between the successive stages of the line. Moreover, considering that a stage is a line portion wherein the charges are stored between two clock pulses, it will be noted that in a simple arrangement, there is only one stage between two bridge electrodes. In addition, a more important point regarding the filter transfer function is that such an arrangement, with two reciprocal transmission direction parallel lines and regularly spaced bridge electrodes, through which every charge transferred from and to the lines passes, plus a complete mixing of the charges within each bridge electrode, has a transfer function with no pole located on the real axis.

Another purpose of this invention is to provide CTD recursive filters comprised of two reciprocal transmission direction lines with bridge electrodes across the single channel, and with storage stages in each line between the bridges. This invention has several important advantages with respect to the known filters and even the above mentioned filter, as far as filter synthesis, from a general point of view, is concerned.

According to another feature of this invention, there is provided a CTD recursive filter wherein the exchange bridge electrodes are split in the same direction as the channel direction, between the two side by side common channel lines so as to form storage memory.

By way of example, in the first mentioned CTD filter according to this invention, odd bridge electrodes might be split in the same direction as the channel direction so as to form storage electrodes. Then, only the even bridge electrodes would be kept as exchange bridge electrodes between the two single-channel delay line.

According to another feature, a memory electrode is of the same length as the preceding split electrode in the same delay line, the electrode order being in accordance with the charge transfer direction in the involved delay line.

According to another feature inside the single channel there is provided a plurality of delay lines with a charge transfer direction reverted from a delay line to the adjacent ones, bridge electrodes being selectively provided between the delay lines at predetermined locations, each bridge electrode bridging two adjacent delay lines.

According to another feature, a storage electrode and an output electrode are provided between two successive exchange bridge electrodes which are located between two of the delay lines. A number of stages are different from one line to the other, a stage being defined by an input electrode. When the number of stages within a delay line is higher than one, they are connected to one another by an electrode and are connected to the same phase bus. However, they do not bridge the concerned delay lines, the electrode being possibly considered as a simulated bridge electrode.

According to another feature, when the filter includes more than two delay lines, a bridge electrode bridging two adjacent lines may serve as a simulated bridge electrode with respect to another line adjacent to one of the involved bridged lines.

According to another feature, an exchange bridge electrode may be divided into two parts, each part feeding one of two split output electrodes with predetermined portions of charges from the two split input electrodes.

According to another feature, the division of an exchange bridge into two parts is implemented by an S-shaped barrier in the electrode, each end of the S-shaped barrier being in front of the output edge of the associated input electrode at a predetermined point along the output edge.

According to another feature, a bridge electrode is divided in three parts by splitting it twice in the same direction as the channel direction, each split being located within each channel area occupied by a delay line, so that the bridge electrode end parts repectively transmit predetermined fraction on the charges from the associated split input electrode to the split output electrode in the same delay line. At the same time, the central bridge electrode part operates as an actual exchange bridge electrode connected between the two associated split input electrodes and the two associated split output electrodes, regarding the charges provided from the two associated split input electrodes, reduced by the predetermined portions.

According to another feature, at one end of a pair of two lines, there is provided an exchange bridge electrode, the associated split input electrode being in one line of the pair and the associated split output electrode being in the other line.

According to another feature, a differential circuit delivering the algebraic difference between the voltages from the said two sections is provided within the channel area of each delay line, in the same direction as the channel direction splittings of a number of predetermined memory electrodes. It selectively connects each split memory electrode section either to input + or input −.

It will appear in the following description that it is possible to put the transfer-function poles in proper positions throughout the complex plane. This is possible because of the transfer-function (Z-transform); the arrangements of the bridge electrodes along the delay lines, with charge distribution from bridge electrodes; and the arrangements of the delay lines, where there are more than 2 in the same channel.

According to a further feature, in a device having an exchange bridge electrode at the end of a pair of electrodes, a first filter may be obtained by connecting the split memory electrodes of the even stages to the respective inputs of a first differential amplifier. A second filter may be obtained by conecting the split memory electrodes of the odd stages to the respective inputs of a second differential amplifier.

BRIEF DESCRIPTION OF THE DRAWINGS

The above mentioned features of the present invention, as well as others, will appear more clearly in the following description of embodiments, the description being made in conjunction with the accompanying drawings, wherein, FIG. 7 is a schematic illustrative view of a charge transfer device in another type of recursive filter according to this invention, FIG. 8 is a graph illustrating the operation of the recursive filter shown in FIG. 7, FIG. 14 is a schematic illustrative view of an alternative of the charge transfer device shown in FIG. 11, FIG. 15 is a diagram showing the poles for a filter embodied in using a charge transfer device as that shown in FIG. 14, FIG. 16 is a schematic illustrative view of an embodiment of the charge transfer device shown in FIG. 14 corresponding to a recursive filter according to the diagram shown in FIG. 15, FIG. 17 is a schematic illustrative view of an embodiment of the charge transfer device shown in FIG. 14 providing a filter having a transfer-function that is complimentary to that of the filter shown in FIG. 16, and FIG. 18 is a schematic view of an alternative of the structure of the charge transfer device shown in FIG. 11.

FIG. 1 shows a composite delay line 1 connected from signal input 2 to signal output 3, and composed of three distinct delay line elements 4–6, and a composite delay line 7 connected from signal input 8 to signal output 9 and composed of three distinct delay line elements 10-12. Signal input 2 is connected to input of delay line element 4, whose output is connected to one input of a two-input two-output adder circuit 13. The first output of adder circuit 13 is connected to an input of delay line element 5 whose is connected to one input of a two-input two-output adder circuit 14. The first output of adder circuit 14 is connected to input of delay line element 6 whose output is connected to signal output 3. Signal input 8 is connected to input of delay line element 10, whose output is connected to the other input of adder circuit 14. The second output of adder circuit 14 is connected to input of delay line element 11 whose output is connected to the other input of adder circuit 13. The second output of adder circuit 13 is connected to input of delay line element 12, whose output is connected to signal output 9.

Figure 1:
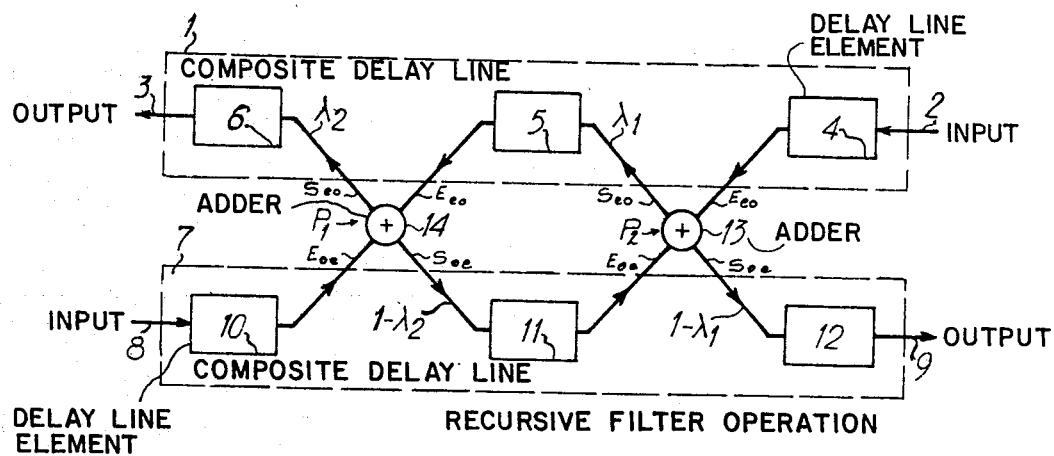
FIG. 1 is a schematic diagram illustrating the operation of a first recursive filter according to this invention.

Inputs of delay line elements 5 and 12 are sized so that when adder circuit 13 simultaneously discharges its contents to those inputs, charges which are transferred into delay line element 5 are proportional to $\lambda 1$, and charges which are transferred into delay line element 12 are proportional in amount to $(1-\lambda 1)$. Similarly, inputs of delay line elements 6 and 11 are sized so that when adder circuit 14 simultaneously discharges its contents to those inputs, charges transferred into delay line element 6 are proportional to $\lambda 2$ and charges transferred to delay line element 11 are proportional, in amount, to $(1-\lambda 2)$. Adder circuits 13 and 14 respectively, add the charges simultaneously delivered from delay line elements 4 and 11, on the one hand, and from delay line elements 5 and 10, on the other hand. Adder circuits 13 and 14 simultaneously receive the applied charges at a first phase clock pulse that also enables the delay line element outputs. These adder circuits become empty at a second phase clock pulse that also enables the delay line element inputs.

Assuming first that only signal input 2 and signal output 3 are in use, it appears that the charges stored at a 1st phase clock pulse in adder circuit 13 have been transferred from delay line elements 4 and 11, while at a 2nd phase clock pulse the charges stored in adder circuit 14 are transferred to delay line elements 6 and 11. It appears clearly that between adders 14 and 13, the delay line element 11 is closing a loop for feeding the back charges. It must be understood that, if each of the composite delay lines 1 and 7 include n delay line elements, together with n−1 adder circuits (respectively instead of 3 delay line elements each and 2 adder circuits), cascaded feedback loops are created. Thus, a recursive filter is actually designed.

In such a recursive filter, coefficients $\lambda 1, \lambda 2, \ldots, \lambda n$ are selected to obtain the desired filter shapes and responses. With an adequate number of coefficients, a current filter shape may be approached. The proper computation of those coefficients may be performed by using a basic theory very close to the recursive filters theory described in the previously mentioned technical book.

It should also be noted that when also using signal input 8 to apply a signal to be filtered, signal output 9 delivers an output signal which is submitted to a filtering action which is different from that filtering to which the output signal from 3 is submitted. Thus, with the arrangement shown in FIG. 1, two different filtering actions may be simultaneously applied.

Figure 2:
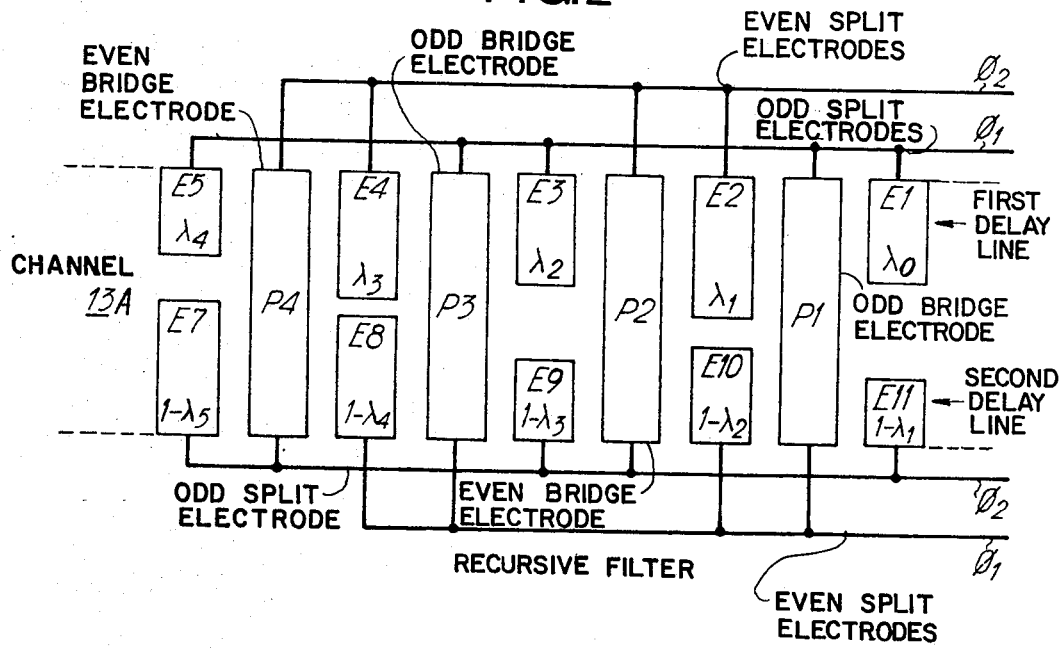
FIG. 2 is an illustrative view of a charge transfer device in a recursive filter according to this invention.

In FIG. 2, there is shown a schematic plan view of the electrodes of a CTD typically operating in a manner similar to the operation of the recursive filter shown in FIG. 1. In the CTD, there is provided a channel 13A limited by two parallel dashed lines. On channel 13A, there is provided a first series of odd split electrodes E1-E5 and a first series of even split electrodes E2 and E4, which altogether constitute the first delay line. On channel 13A, there are also provided a second series of odd split electrodes E7-E11 and a second series of even split electrodes E8 and E10, which altogether constitute the second delay line. The first and second odd split electrodes from the pair E1-E11, E3-E9 and E5-E7, and the first and second even split electrodes form the pair E2-E10 and E4-E8. On channel 13 there are two odd bridge electrodes P1 and P3, respectively located between the pairs E1-E11, E2-E10, and the pairs E3-E9, E4-E8. There are also two even bridge electrodes P2 and P4, respectively located between the pairs E2-E10, E3-E9, and the pairs E4-E8, E5-E7. Bridge electrodes P1-P4 each occupy the entire width of the channel 13A, contrary to any split electrode. Between the split electrodes of a pair, which are facing in the transverse direction of the channel 13A, there exists a gap. Electrodes E1,P1,E3,P3,E8 and E10 are connected to bus $\phi 1$, which delivers the 1st phase clock pulses while electrodes E2, P2, E4, P4, E7, E9 and E11 are connected to bus $\phi 2$, which delivers the 2nd phase clock pulses.

The lengths of split electrodes E5 and E8 respectively are equal to $\lambda 1$ and $(1-\lambda 1)$. The lengths of split electrode E4 and E9 respectively are equal to $\lambda 2$ and $(1-\lambda 2)$, those of split elctrodes E3 and E10 respectively are equal to $\lambda 3$ and $(1-\lambda 3)$, and those of split electrodes E2 and E11 respectively, are equal to $\lambda 4$ and $(1-\lambda 4)$. The length of split electrode E7 is equal to $\lambda 0$ and that of split electrode E1 is equal to $\lambda 5$.

In the following description of the operation of the device shown in FIG. 1, use will be made of the model currently used for illustrating CTD operation, in particular as it is described in Chapter II of the previously mentioned technical book. An assumption is made that under the split electrodes, the areas of channel 13A are less doped or implanted than the areas under the bridge electrodes. In such conditions, when a bridge electrode has the same potential as a split electrode, the level for the charges under the bridge electrode is below the level for the charges under the split electrode. Moreover, it is assumed that the rest potential is the same for both bus $\phi 1$ and $\phi 2$ and that in the on-condition, one of the buses reduces the level under connected split electrodes below the level under a bridge electrode at a rest potential.

Figure 3A:
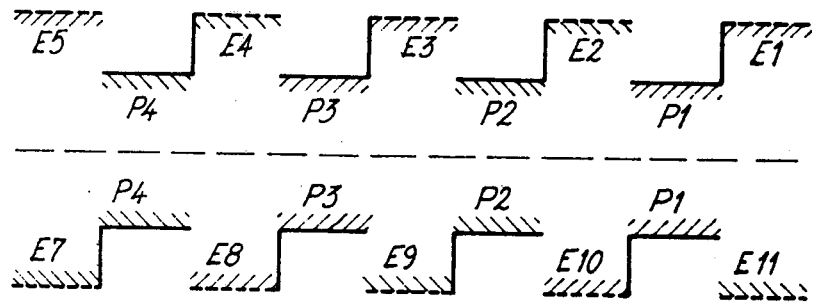
FIGS. 3a–3c are diagrams illustrating the transfers of charges through the device shown in FIG. 2.

With the above-mentioned conditions, the operation of the device shown in FIG. 2 will be described in conjunction with FIGS. 3A-3C. In FIG. 3A, the charge levels under the electrodes are indicated, by assuming that those electrodes are at the rest potential. Each charge level is indicated by the same reference as the electrode under which it is located. Moreover, the levels corresponding to adjacent electrodes connected to the same bus are connected by vertical segments to show that those levels are moved up and down at the same time, depending on the rest-condition or the on-condition of the connected bus. Finally, the direction of the level coordinate axis is reversed for the electrodes located under the symmetry axis of the CTD channel 13A, with respect to the corresponding direction for electrodes located above the symmetry axis.

In FIG. 3A both buses $\phi 1$ and $\phi 2$ are assumed to be at rest so that all of the split electrode levels are equal, but are higher than the bridge electrode levels. Therefore, the charges are trapped under the bridge electrodes respectively.

Figure 3B:
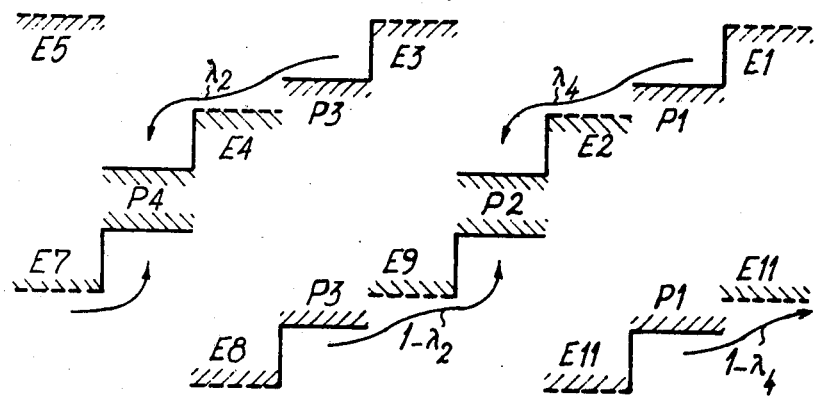

In FIG. 3B, it is assumed that bus $\phi 1$ is on while $\phi 2$ is at rest. Thus, charge levels E2, P2; E4, P4; and E9, P2; are relatively lower. Charge level P3 then is, on the one hand, above charge levels E4 and P4, and, on the other hand, above charge levels E9 and P2. Therefore, the charges previously trapped under bridge P3 flow as indicated by the arrows toward P4 and P2. The distribution between the two charge flows is determined by the length $\lambda 2$ of electrode E4, and by the length $(1-\lambda 2)$ of electrode E9. The level P1 is also, on the one hand, above levels E2 and P2, and, on the other hand, above level E11. Thus the charges previously trapped under bridge P1 are distributed in a similar manner, as just described above. Finally, when bus $\phi 1$ is reset to the rest-condition, there are no longer any charges under the odd bridge electrodes, because they are then distributed under the even bridge electrodes. The charges received under bridge P2 from under bridge P3, through electrode E9, and from under bridge P1, through electrode E2, are being accumulated, that is added in amount. Thus, it appears clearly that the bridge electrodes of the device shown in FIG. 2 have the same functions as the adder circuits shown in FIG. 1.

Thereafter, bus $\phi 1$ remains at rest while bus $\phi 2$ is turned on. Then the device condition is indicated in FIG. 3C. Reasoning in the same manner as just described, it appears that the charges previously trapped under the even bridge electrodes flow to become trapped under the odd bridge electrodes. The coefficients indicated close to the arrows indicated the distribution coefficients. From the above described operation, the device shown in FIG. 2 actually operates in the same manner as the circuit shown in FIG. 1. The delay line element input widths, in FIG. 1, are implemented by the lengths of the split electrodes under which the charges are moving.

Electrode E1 is connected from a signal source and serves as an input electrode, as well as electrode E7, while electrode E5 may serve as an output electrode, as well as electrode E11, respectively.

It appears that bridge electrodes in the CTD shown in FIG. 2 add charges, then distribute them in precisely predetermined proportions. At time $\phi 1$, odd bridge electrodes are distributing and, at time $\phi 2$, even bridge electrodes are distributing. Between times $\phi 1$ and $\phi 2$, charges are added and trapped under even bridge electrodes while, between times $\phi 2$ and $\phi 1$, charges are added and trapped under odd bridge electrodes. Thus, as already mentioned, the device shown in FIG. 2 enables charges to progress along the two adjacent delay lines in directions opposite from one to the other, while providing exchanges of charges between those delay lines from place to place, the exchange places being the bridge electrodes.

The graph shown in FIG. 1 illustrates more thoroughly the operation of the device shown in FIG. 2. Thus adder circuits 13 and 14 may be considered as two pumps P1 and P2, which receive charges to be added, on their inputs Eoe and Eeo. Then, these adders distribute the added charges over their output Soe and Seo, in accordance with the indicated proportions. Between the output Seo of a pump and the input Eoe of the next pump, a delay circuit is inserted. The delay is labelled $Z^{-1}$ in order to indicate that the charges are delayed by a clock period while they are being transferred through that delay circuit. So, the delay is between an output Soe and next input Eoe.

The graph shown in FIG. 1 may be considered as a generalized showing of comprising pumps P0-Pn, representing the bridge electrodes by P1-Pn and the substrate by P0. It appears that, at each clock pulse, the pack of charges included in the CTD is redistributed between the n bridge electrodes and the substrate. The charges at time $(t+T)$, wherein T is the clock period, are derived from the charges at time t in pumps P0-Pn by the equations:

$$X_i(t+T) = \sum_{k=1}^{N} A_{ik} X_k(t) + b_i(t) \text{ with } i = 1, 2, \ldots, N \quad (1)$$

$$X_O(t+T) = \sum_{k=1}^{N} A_{Ok} X_k(t) + A_{OO} X_O(t)$$

In this formula, each $b_i(t)$ is the charge input to the corresponding input $P_i$ with $i+0$. The coefficients $A_{ik}$ are constant, depending on the structures, (i.e. lengths of the split electrodes on both sides of a bridge electrode). Coefficient $A_{OO}$ takes into account the fact that the charge amount has not changed in the substrate.

In general there is only one input $b_1(t)$, and $b_i(t)$ is nil for $i \neq 1$. Similarly, often there will be only one output $A_{O1}$ or $A_{ON}$. The condition of conservation of the charges and its sign needs that:

$$A_{ik} \geq O, \text{ with } i, k - O, 1, \ldots, N \quad (2)$$
$$\sum_{i=O}^{N} A_{ki} = 1, A_{OO} = O \text{ and } A_{iO} = O, \text{ if } i \neq O$$

The matrix A of coefficients $A_{ik}$ of the system (1) is a stochastic matrix. As it is a matrix having all its coefficients positive or nil, results in a number of constraints on the proper angular frequencies of the filter. Therefore, the actual filter degree must be increased to comply with a predetermined degree. For instance, the track of matrix A and its iterated matrices is positive. Thus, the sum of the $n^{th}$ powers of its proper values is always positive. This value is obtained by adding compliment roots. Therefore, in the complex plane, the possible domain for the roots fulfills the unit circle as far as the degree of the filter is not limited. Indeed, experience shows that a type of recursive filter, as shown in FIGS. 1 and 2 results in filter attenuation poles that are all on the real axis. This attenuation prevents compliance with any filter shape.

Figure 4:
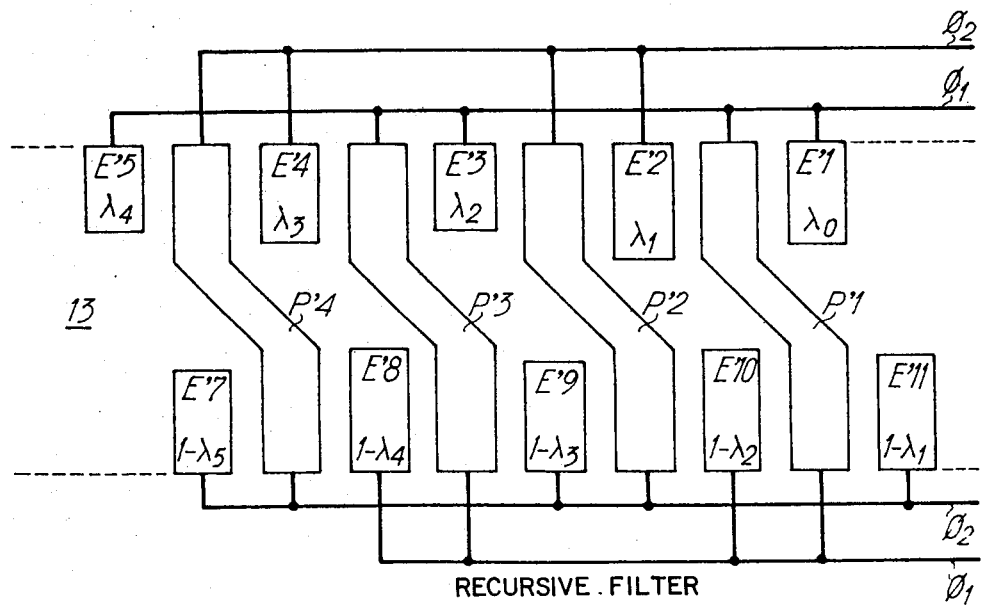
FIG. 4 is a schematic illustrative view of an alternative of the device shown in FIG. 2.

The CTD shown in FIG. 4 operates in a manner which is identical to the CTD shown in FIG. 1. The changes are only concerned with the bridge electrodes P'1-P'4 which are no longer right-angle rectangular, but which somewhat are S-shaped. The split electrodes E'1-E'5 and E'7-E'11 are located in the S curves. The bridge electrodes always occupy the entire channel width. Thus, the S-shaped bridge electrodes may make it easier to design the masks and then to the manufacture of the device. The split electrode lengths are determined as in the device shown in FIG. 1.

Figure 5:
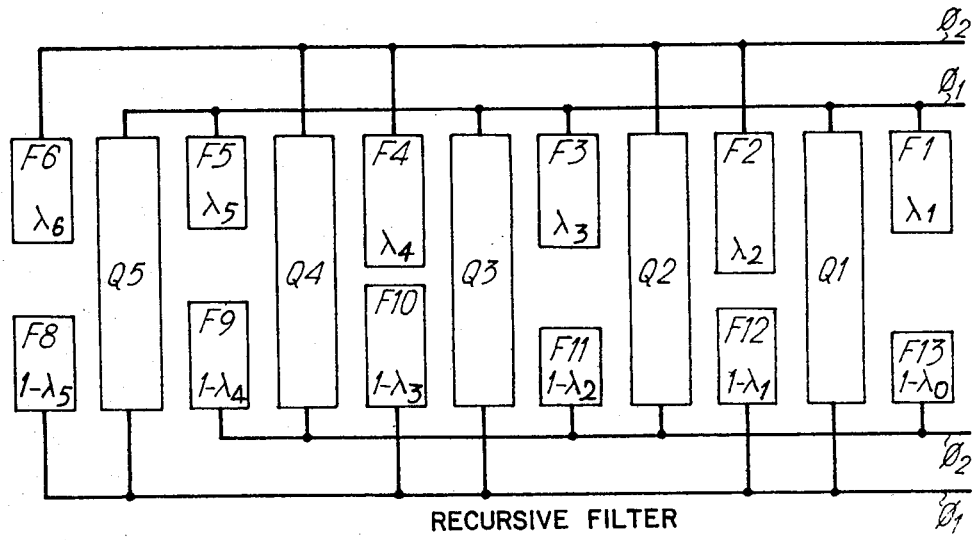
FIG. 5 is a schematic illustrative view of another alternative of the device shown in FIG. 2, FIGS. 6a–6c are diagrams illustrating the transfers of charges through the device shown in FIG. 5.

Seen from above, the (FIG. 5) CTD has substantially the same structure as the CTD shown in FIG. 1, except that area dopings or implantations under split electrodes and bridge electrodes are different because they have opposite signs. This means that, under split electrodes, the charge level is lower than under bridge electrodes using the same assumptions as previously mentioned. Fig. 5 includes a first series of split electrodes F1–F6 and a second series of split electrodes F8–F13, as well as the bridge electrodes Q1–Q5. Electrodes F1, F3, F5, F8, F10, F12, Q1, Q3 and Q5 are connected to the bus $\phi1$; while electrodes F2, F4, F6, F9, F11, F13, Q2 and Q4 are connected to the bus $\phi2$. Electrodes F1 and F12 have lengths equal to $\lambda1$ and $(1-\lambda1)$ respectively, electrodes F2 and F11 have lengths equal to $\lambda2$ and $(1-\lambda2)$ respectively, and so on.

Figure 3C:
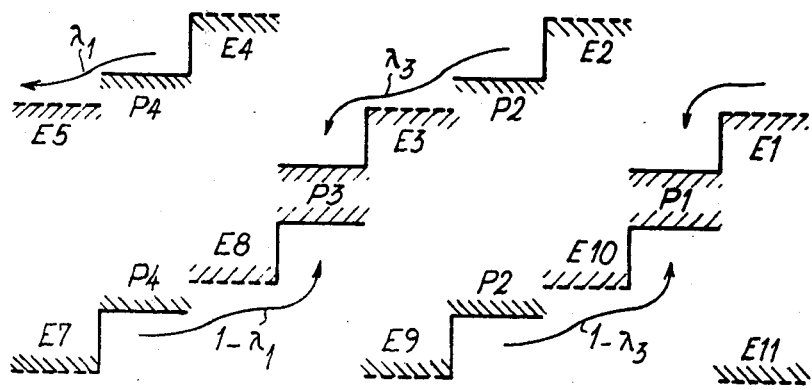
Figure 6A:
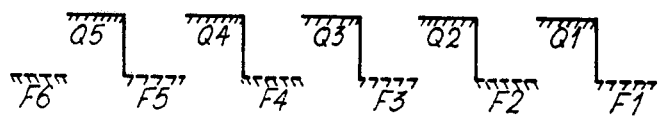
Figure 6B:
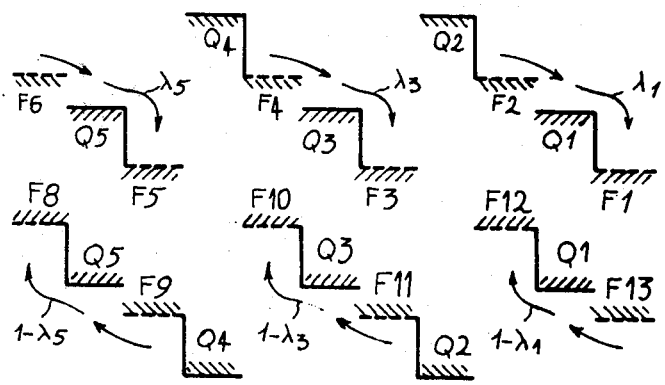
Figure 6C:
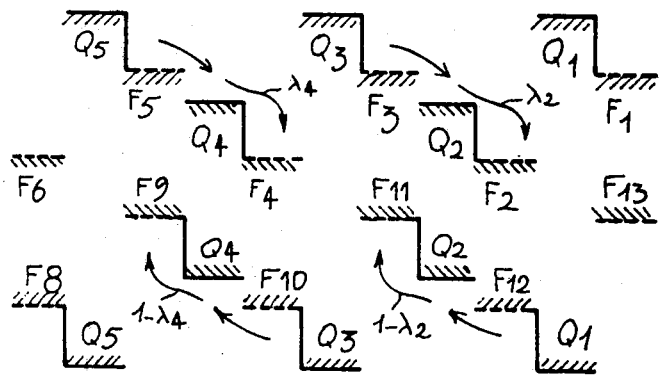

FIGS. 6A–6C, adopt the conventions which are equivalent to those already used in FIGS. 3A–3C, in order to illustrate the operation of the device shown in FIG. 5. In FIG. 6A, it is assumed that both buses $\phi1$ and $\phi Z$ are at rest. The charges are trapped under the split electrodes. In FIG. 6B it is assumed that bus $\phi1$ is on while bus $\phi1$ is at rest. The charges which were trapped under electrode F2 are moved through level Q1 to F1. Those charges which were trapped under electrode F13 are moving through level Q1 to electrode F12, while those which were trapped under electrode F4 are moved through level Q3 to F3, and so on. It appears that two charges flow simultaneously and pass under bridge electrodes Q1,Q3 and Q5 which thus operate adders, and moreover, from the bridge electrodes, the charges are distributed in accordance with the lengths of the electrodes to which they are transmitted, those lengths being $\lambda1$, $(1-\lambda1)$, $\lambda3$, $(1-\lambda3)$, etc. Therefore, the operation is still in accordance with that which has been described in conjunction with the graph shown in FIG. 1. In FIG. 6C, it is assumed that bus $\phi1$ is at rest while bus $\phi2$ is on. The charges then travel under bridge electrodes Q2 and Q4. It is easy to rediscover an operation which is the same as described above, except that this one is shifted by one stage.

In principle, the CTD shown in FIG. 6 is equivalent to that shown in FIG. 2. As a difference, it will be noted that between the clock pulses in the CTD of FIG. 6, the charges are stored under split electrodes; but that in the CTD of FIG. 2 they are stored under bridge electrodes. With a single CTD, it is also possible to provide two inputs and two outputs, thereby enabling different simultaneous filtering actions.

FIG. 7 shows a CTD which is also composed of a single channel having limits shown by two dashed parallel lines. Three series of split electrodes are provided on that channel. The first series in the mean channel portion includes split electrodes F1–F12; the second series in the upper channel portion includes split electrodes F13–F16; and the third series in the lower channel portion includes split electrodes F17 and F18. Respectively between split electrodes F1 and F2, F3 and F4, F5 and F6, F7 and F8, F9 and F10, F11 and F12, F13 and F14, F15 and F16, F17 and F18, memory electrodes Q1, Q3,Q5,Q7,Q9,Q11, Q13,Q15, and Q17 are located. On both sides of a memory electrode, the split electrodes have the same length as the related memory electrode.

Across both the upper and the mean channel portions, bridge electrodes R1, R3 and R5 are respectively provided between electrode F2, on the one hand, and electrode F3 and F16, on the other hand. They are also provided between electrodes F7 and F14, on the other hand; and, between electrodes F10 and F13, on the one hand and electrode F11, on the other hand. Across both the mean and lower channel portions, bridge electrodes R2 and R4 are respectively provided between electrode F4, on the one hand, and electrodes F5 and F18, on the other hand; and between electrodes F8 and F17, on the one hand, and electrode F9, on the other hand. The lower, mean and upper split electrodes are separated by diffused or implanted barriers.

The odd split electrodes, together with the memory electrodes, are connected to bus $\phi1$; while the even split electrodes and the bridge electrodes are connected to bus $\phi2$.

The length of electrodes F1, Q1 and F2 is equal to the unit of length. The length of electrodes F3, Q3 and F4 is equal to 1. The length of electrodes F5, Q5 and F6 is equal to $\lambda2$. The length of electrodes F7, Q7 and F8 is equal to $\lambda3$. The length of electrodes F9, Q9 an F10 is equal to $\lambda4$. The length of electrodes F11, Q11 and F12 is equal to $\lambda5$. The length of electrodes F15, Q15 and F16 is equal to $\mu3$. The length of electrodes F17, Q17 and F18 is equal to $\mu4$. The length of electrodes F13, Q13 and F14 is equal to $\mu5$. As in the device shown in FIG. 2 an assumption is made that the areas under the split electrodes are suitably and identically doped or implanted with respect to the areas under the bridge and memory electrodes. Moreover, in the upper channel portion, between electrodes R1 and R3, there are only three electrodes that are wider than the seven electrodes between the electrodes R1 and R3 in the mean channel portion. Indeed, a constant gap is needed between successive electrodes. Those width conditions also exist between electrodes R3 and R5, and, regarding the mean and lower channel portions between electrodes R2 and R4.

Before describing the operation of the device shown in FIG. 7, it will be assumed that before turning bus $\phi2$ on, the charges are trapped under memory electrodes Q1–Q17. When bus $\phi2$ is turned on, as here-above described in conjunction with FIGS. 3a–3c, charges flow from electrodes Q1 and Q15 to electrode R1, from electrodes Q3 and Q17 to electrode R2, from electrodes Q5 and Q13 to electrode R3, from electrodes Q7 to electrode R4, and from electrode Q9 to electrode R5.

When bus $\phi1$ has been turned on, charges under electrode R1 flow proportionally to the length $\lambda1$ through electrode area F3 to electrode area Q3; charges under electrode R2 flow proportionally to the length $\lambda2$ through area F5 to area Q5; charges under electrode R3 flow proportionally to the length of $\lambda3$ through area F7 to area Q7 flow and proportionally to $\mu3$ are transferred through F15 to Q15; charges under electrode R4 flow proportionally to the length of $\lambda4$ through areas F9 to Q10 and proportionally to $\mu4$ through F17 to Q17; and charges under electrode R5 flow proportionally to the length of $\lambda5$ through area F11 to area Q11 and proportionally to $\mu5$ are transferred through area F13 to area Q13.

The graph shown in FIG. 8 illustrates the charge exchanges between points R1–R5, which represent the bridges or bridge electrodes. Electrode R1 receives input signal X (in fact through electrodes F1, Q1, F2) and electrode R5 delivering an output signal (in fact through electrodes F11, Q11, F12). Charges under electrodes R1–R5 are assumed to be X1–X5, at the clock time for bus $\phi2$. Point R1 (FIG. 8) is connected, in the direction of the arrow, to point R2, via the block $Z^{-1}$ which lies between the two points. A square labelled $Z^{-1}$, shows in a conventional manner that the signal is delayed there by a sample period.

Then it is possible to write the following system of equations (3), that is similar to the above mentioned system (1).

$$zX1 = 0 + 0 + \mu3 X3 + 0 + 0 + X \quad (3)$$

$$zX2 = \lambda1 X1 + 0 + 0 + \mu4 X4 + 0$$

$$zX3 = 0 + \lambda2\ X2 + 0 + 0 + \mu5\ X5$$

$$zX4 = 0 + 0 + \lambda3\ X3 + 0 + 0$$

$$zX5 = 0 + 0 + 0 + \lambda4 X4 + 0$$
$$ZY = 0 + 0 + 0 + 0 + \lambda5 X5$$

System (3), indicates by z that the value following it will be effective at the next clock or sample time. It should be noted that in the particular case shown in FIG. 7, coefficients 1 and 2 are equal to 1 since there is no sharing of electrodes R1 and R2 at outputs.

Typically, the structure of the device shown in FIG. 7, as indicated by the graph shown in FIG. 8, includes two memory stages as the charges go from point 2 to point 4, but only one memory stage as they go from point 4 to point 2. Obviously that structure can be generalized. Devices may be provided with N memory stages between two points in the forward direction, and with P memory stages in the backward direction, between the same points, (N being different than P).

That possibility permits richer matrices, such as (1) or (3), to be rendered and offers a greater number of parameters for designing a filter having a predetermined shape.

Figure 9:
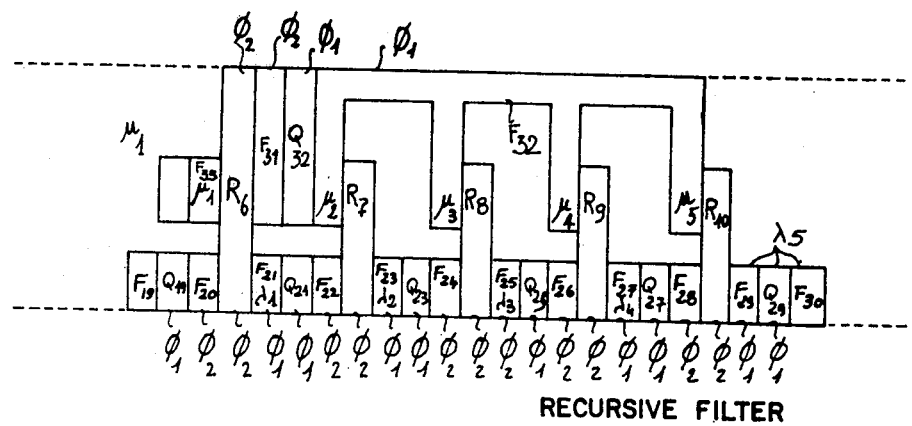
FIG. 9 is a schematic illustrative view of another charge transfer device in a further type of recursive filter according to this invention.

FIG. 9 shows another CTD which also comprises a single channel limited by two parallel dashed lines. A series of split electrodes F19–F30 of that channel are provided in the lower portion. Between electrodes F19 and F20, there is a memory electrode Q19; between electrodes F21 and F22, a memory electrode Q21; between electrodes F23 and F24, a memory electrode Q23; between electrodes F25 and F26, a memory electrode Q25; between electrodes F27 and F28, a memory electrode Q27; and between electrodes F29 and F30, a memory electrode Q29. Between electrodes F20 and F21, a bridge electrode R6 occupies the entire width of the channel; between electrodes F22 and F23, a bridge electrode R7 occupies both the lower and mean channel portions; between electrodes F24 and F25 is a bridge electrode R8, similar to R7; between electrodes F26 and F27 is a bridge electrode R9, similar to R7; and between electrodes F26 and F27 is a bridge electrode R10, similar to R7. In front of electrode F21, across the lower and/or mean channel portions, is an electrode F21. Similarly, in front of electrodes F22, F24, F26 and F28 electrode ends are provided respectively. They are similar to electrode F31, but the opposite ends are connected to form a single comb-shaped electrode F32. Between adjacent edges of electrodes F31 and F32, a memory electrode Q32 is provided.

Electrodes F19, Q19, F21, Q21, F23, Q23, F25, Q25, F27, Q27, F29, Q29, F32, Q32 are connected to bus $\phi1$ while electrodes F20, F22, F24, F26, F28, F30, F31, R6, R7, R8, R9 and R10 are connected to bus $\phi2$.

Electrodes F19, Q19, and F20 have a length equal to 1; electrodes F21, Q21 and F22 have a length equal to $\lambda$ 1; electrodes F23, Q23 and F24 have a length equal to $\lambda2$; electrodes F25, Q25 and F26 have a length equal to $\lambda3$; electrodes F27, Q27 and F28 have a length equal to $\lambda4$; and electrodes F29, Q29 and F30 have a length equal to $\lambda5$. Moreover, the electrode end of F32, that is adjacent to electrode R7, has a length equal to $\mu2$; the one adjacent to electrode R8 has a length equal to $\mu3$; the one that is adjacent to electrode R9 has a length equal to $\mu4$; and that the one that is adjacent to electrode R10 has a length equal to $\mu5$;

It is assumed that, as in the device shown in FIG. 2, under split electrodes F19–F31, as well as under comb electrode F32, the channel areas are suitably doped or implanted with respect to the areas under memory and bridge electrodes.

In the following description of the operation of the device shown in FIG. 9, it will be assumed that before turning on bus $\phi2$, charges are trapped under memory electrodes Q19–Q29 and Q32. When bus $\phi2$ is turned on, as hereabove described in conjunction with FIGS. 3a–3c, charges respectively flow from under electrode Q19 to the area of electrode R6, from Q32 to R6, from Q21 to R7, from Q23 to R8, from Q25 to R9, from Q27 to R10, and from Q29 to output Y through F30. Input X is coupled to electrode F19.

When bus $\phi1$ is turned on, charges flow respectively from electrode R6 proportionally to $\lambda1$ through electrode F21 to electrode Q21; from R7 proportionally to $\lambda2$ through F23 to Q23 and proportionally to $\mu2$ through F32 to Q32; from R8 proportionally to $\lambda3$ through F25 to Q25 and proportionally to $\mu3$ through F32 to Q32; from R9 proportionally to $\lambda4$ through F27 to Q27 and proportionally to $\mu4$ through F32 to Q32; and from R10 proportionally to $\lambda5$ through F29 to Q29 and proportionally to $\mu5$ through F32 to Q32.

Figure 10:
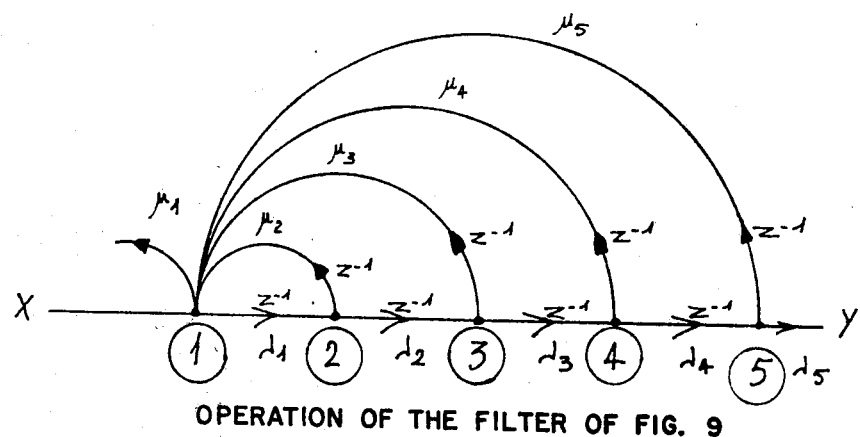
FIG. 10 is a graph illustrating the operation of the recursive filter shown in FIG. 9.

The graph shown in FIG. 10 illustrates the charge exchanges between points R6–R10 which represent the bridge electrodes, electrode R6 receiving the input signal X and electrode R10 delivering through electrode F30 the output signal Y. In the graph shown in FIG. 10, above each arrow, $Z^{-1}$ is written to indicate that the signal transferred between the two concerned points is delayed by a sample period.

Then the equation system (1) may be written in the form of the following produce of matrices:

$$\begin{bmatrix} X1 - X \\ X2 \\ X3 \\ X4 \\ X5 \end{bmatrix} = \begin{bmatrix} 0 & \mu2 & \mu3 & \mu4 & \mu5 \\ \lambda1 & 0 & 0 & 0 & 0 \\ 0 & \lambda2 & 0 & 0 & 0 \\ 0 & 0 & \lambda3 & 0 & 0 \\ 0 & 0 & 0 & \lambda4 & 0 \end{bmatrix} \times \begin{bmatrix} X1 \\ X2 \\ X3 \\ X4 \\ X5 \end{bmatrix} \quad (4)$$

The determinant of the matrix of coefficients may be written $$D(z) = z^5 - \lambda1\mu2 z^3 - \lambda1\lambda2\mu3 z^2 - \lambda1\lambda2\lambda3\mu4 z - \lambda1\lambda2\lambda3\lambda4\mu5 \quad (5)$$

It would be possible to ascertain that the roots of the polynom (5) are generally complex, inside the unit circle in the complex plane.

Figure 11:
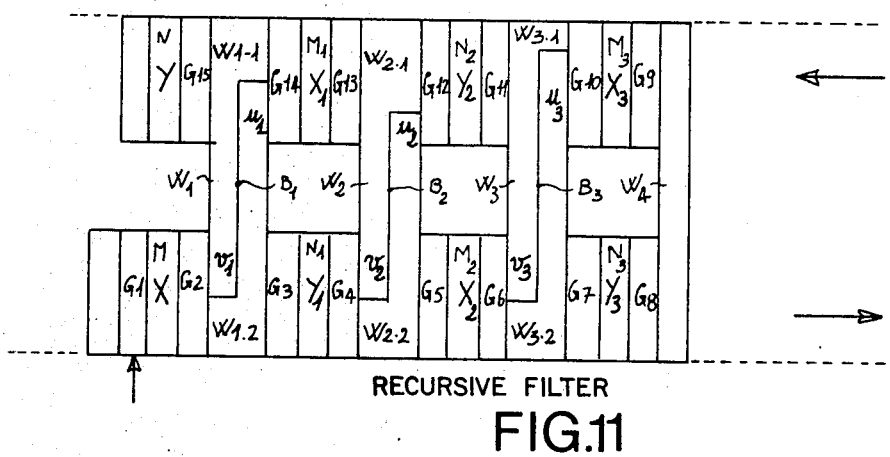
FIG. 11 is a schematic illustrative view of a further charge transfer device in a recursive filter according to this invention.

FIG. 11, shows a further charge transfer device also comprising a single channel limited by two parallel dashed lines. That channel is comprised of an upper portion, a mean portion and a lower portion. In the lower portion, split electrodes G1–G8 are provided, with memory electrode M between electrodes G1 and G2, a memory electrode N1 between electrodes G3 and G4, a memory electrode M2 between electrodes G5 and G6, and, a memory electrode N3 between electrodes G7 and G8. In the upper portion, split electrodes G9–G15 are provided, with a memory electrode M3 between G9 and G10, a memory electrode N2 between G11 and G12, a memory electrode M1 between G13 and G14. Electrodes G2 and G15, as well as G3 and G14, G4 and G13, G5 and G12, G6 and G11, G7 and G10, and G8 and G9 are transversely facing the channel direction. Between electrodes G2–G15, on the one hand, and electrodes G3–G14, on the other hand, a bridge electrode W1 is provided; between G4–G13 and G5–G12 a bridge electrode W2; and between G6–G11 and G7–G10 a bridge electrode W3. On the other side of electrode G15 with respect to electrode W1, there is a memory electrode N.

The bridge electrodes W1–W3 are not identical to those shown in FIGS. 2, 4 and 6. Indeed bridge electrode W1 is separated into two bridge sections W1.1 and W1.2 by a barrier B1 that the charges cannot pass. Such an impassable barrier may be implemented, according to a conventional manner, for instance, by providing along the line B1 a suitable implantation or diffusion. Similarly bridge electrode W2 is divided into two bridge sections W2.1 and W2.2 and bridge electrode W3 is divided into two bridge sections W3.1 and W3.2. On the contrary, bridge electrode W4 is a simple bridge electrode, such as those shown in FIG. 2.

Bridge section W1.1 has a length v1 adjacent to split electrode G2, a length $(1-u1)$ adjacent to split electrode G14 and a length of value 1 adjacent to split electrode G15. Bridge section W1.2 has a length $(1-v1)$ adjacent to split electrode G2, a length u1 adjacent to split electrode G14 and a length 1 adjacent to electrode G3. Bridge sections of W2 and W3 have a similar structure, the lengths corresponding to the above mentioned lengths of bridge section of W1 being respectively v2, $(1-u2)$, 1, $(1-v2)$, u2, 1 and v3, $(1-u3)$, 1, $(1-v3)$, u3, 1. It is to be noted that an assumption is made that any split electrode and any memory electrode have, in the device shown in FIG. 11, a length equal to 1.

Electrodes G1, M, G3, N1, G5, M2, G7, N3, G9, M3, G11, N2, G13, M1, G15 and N are connected to bus $\phi1$ while electrodes G2, G4, G6, G8, G10, G12, G14, W1, W2, W3 and W4 are connected to bus $\phi2$.

The description of the operation of the device shown in FIG. 11 will be made in assuming that before bus $\phi2$ is turned on, charges are trapped under memory electrodes M, N, M1–M3 and N-1-N3. When bus $\phi2$ has been turned on, as previously described in conjunction with FIGS. 3a–3c, charges respectively flow from electrode M proportionally to v1 to bridge section W1.1, and proportionally to $(1-v1)$ and to bridge section W1.2; from N1 proportionally to v2, to bridge section W2.1, and proportionally to $(1-v2)$, and to bridge section W2.2: charges flow from electrode M2 proportionally to v3, to bridge section W3.1 and proportionally to $(1-v3)$, to bridge section W3.2. They also flow from N3 to W4; from M3 proportionally to $(1-u3)$, to bridge section W3.1 and proportionally to u3 to bridge section W3.2. They flow from N2 proportionally to $(1-u2)$, to bridge section W2.1 and proportionally to u2 to bridge section W2.2; from M1 proportionally to $(1-u1)$, to bridge section W1.1, and proportionally to u1 to bridge section W1.2. They also flow from N to output of the device.

As a result, at the end of clock time $\phi2$, bridge section W1.1 is trapping v1 times the charge X, previously trapped under electrode M, plus $(1-u1)$ times the charge, previously trapped under electrode M1, etc.

When bus $\phi1$ has been turned on, charges flow from bridge section W1.1 to electrode N through electrode G15; from W1.2 to N1 through G3; from W2.1 to M1 through G13; from W2.2 to M2 through G5; from W3.1 to N2 through G11; from W3.2 to N3 through G7; and from W4 to M3 through G9.

Figure 12:
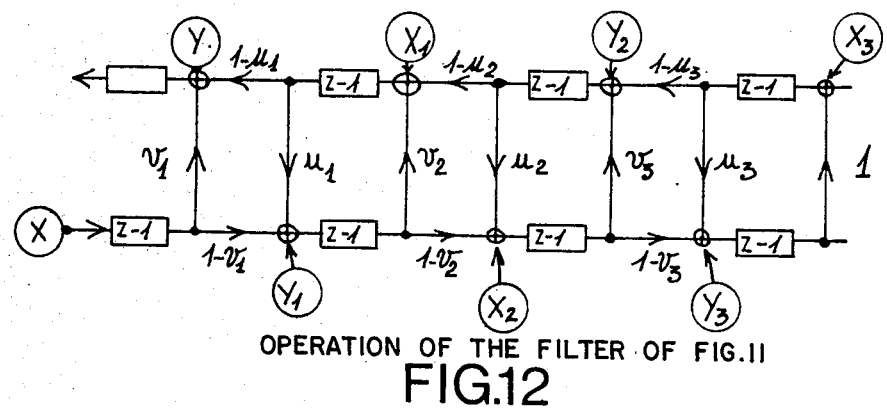
FIG. 12 is a graph illustrating the operation of the recursive filter shown in FIG. 11.

The graph shown in FIG. 12 illustrates the charge exchanges between points X, X1, X2, X3, Y, Y1, Y2, and Y3. The arrows indicate the charge transfer directions. The values indicated close to the arrows respectively indicate the proportions of charges travelling from a node. The squares with $Z^{-1}$ are located on certain sections to indicate that the charge transfer is delayed by a sampling period. The small circles containing crosses indicate that there are additions of charges in those points.

The basic difference regarding the operation result for a bridge of the device shown in FIG. 2 and for a bridge of the device shown in FIG. 11 may be summarized as follows. In both cases, charges, in accordance with the transfer direction either from left to right in the lower channel portion, or from right to left in the upper channel portion, enter the bridge at the lower left side and the upper right side. In the case of bridges shown in FIG. 2, there is only one parameter $\lambda$, and its complement $(1-\lambda)$, for delivering charges at the upper left side and the lower right side. In the case of the device shown in FIG. 11, there are two parameters u and v (and their complements) to define the distribution of the charges having entered the bridge sections. Bridge W4 simply operates to fold the transfer direction.

From the graph shown in FIG. 12, the following system of equations may be derived. It is to be noted that alphanumerical references of points X, X1, X2, X3 and Y, Y1, Y2 and Y3 have been selected so as to make the following calculations easier. Moreover, it is assumed that X represents the input signal and Y represents the output signal.

$$\bar{z}X1 = v2Y1 + (1-u2)Y2$$

$$\bar{z}X2 = (1-v2)Y1 + u2Y2$$

$$\bar{z}X3 = Y3$$

$$\bar{z}Y1 = u1X1 + (1-v1)\bar{z}X$$

$$\bar{z}Y2 = v3X2 + (1-u3)X3$$

$$\bar{z}Y3 = (1-v3)X2 + u3X3$$

(6)

which may be rewritten $$\bar{z}\begin{vmatrix} Y1 \\ Y2 \\ Y3 \\ X1 \\ X2 \\ X3 \end{vmatrix} = \begin{vmatrix} 0 & 0 & 0 & u1 & 0 & 0 \\ 0 & 0 & 0 & 0 & v3 & 1-u3 \\ 0 & 0 & 0 & 0 & 1-v3 & u3 \\ v2 & 1-u2 & 0 & 0 & 0 & 0 \\ 1-v2 & u2 & 0 & 0 & 0 & 0 \\ 0 & 0 & 1 & 0 & 0 & 0 \end{vmatrix} X \begin{vmatrix} Y1 \\ Y2 \\ Y3 \\ X1 \\ X2 \\ X3 \end{vmatrix} + \bar{z}X\begin{vmatrix} 0 \\ 0 \\ 0 \\ 1-v1 \\ 0 \\ 0 \end{vmatrix}$$

(7)

which may further be rewritten:

$$z\vec{Y} = [B]\vec{X} \tag{8}$$

$$z\vec{X} = [C]\vec{Y} + \beta\vec{X}$$

or still $$z^{-2}\vec{X} = [C]\ z\ \vec{Y} + z\beta\vec{X} \tag{9}$$

$$= [C][B]\vec{X} + z\beta\vec{X}$$

It is suitable to write $z^{-2}=z$, that is, to call "clock delay" the delay corresponding to two elementary sampling periods. The following relationship results therefrom $$z\vec{X} = [A]\vec{X} + \vec{b} \tag{10}$$

with $$[A] = [C]\ B \text{ and } \vec{b} = zX(1-v1)\begin{bmatrix}1\\0\\0\end{bmatrix}$$

Consideration will now be given, by way of example, to the particularly simple case wherein, for the device shown in FIG. 11 and the graph shown in FIG. 9:

$$u2 = v2 = u3 = v3 = 0$$

Then it results:

$$[C] = \begin{bmatrix}u1 & 0 & 0\\0 & 0 & 1\\0 & 1 & 0\end{bmatrix} \text{ et } B = \begin{bmatrix}0 & 1 & 0\\1 & 0 & 0\\0 & 0 & 1\end{bmatrix} \tag{11}$$

and $$[C][B] = [A] = \begin{bmatrix}0 & u1 & 0\\0 & 0 & 1\\1 & 0 & 0\end{bmatrix}$$

The matrix is a quasi-permutation matrix. Its proper angular frequency equation is:

$$\det(z-A) = z^3 - u1 \tag{12}$$

with $u1 = r^3$, the proper angular frequencies have the same modulus r and are represented by the diagram shown in FIG. 15 in the z-plane.

The result, therefrom is:

$$\vec{X} = (z-[A])^{-1}\vec{b}$$

that is, the calculation being terminated:

$$X1 = X(1-v1)\frac{z^3}{z^3 - r^3} \tag{13}$$

$$X2 = X(1-v1)\frac{z}{z^3 - r^3}$$

$$X3 = X(1-v1)\frac{z^2}{z^3 - r^3}$$

After the description of the embodiment shown in FIG. 14, a description of how to utilize the results of the above mentioned calculations will be made.

FIG. 14 shows a CTD very similar to that shown in FIG. 11. Indeed, it includes the same split electrodes G1-G15, the same bridge electrodes W1-W4 and the same memory electrodes, N, N1, N2 and N3. However, memory electrodes M, M1, M2 and M3 are replaced by split memory electrodes M', M'' which together occupy the place previously occupied by electrode M; M'1, M''1 which together occupy the place previously occupied by M1; M'2, M''2 which together occupy the place previously occupied by M2; and M'3, M''3 which together occupy the place previously occupied by M3.

Memory electrode elements M', M'1, M'2 and M'3 are parallel connected to one input of a differential amplifier AMP1 while memory electrode elements M'', M''1, M''2 and M''3 are connected parallel to the other input of the differential amplifier AMP1. The output of amplifier AMP1 delivers the filter output signal S.

Such an arrangement is very similar to that utilized in non recursive split-electrode CTD filters. However, in the present embodiment, it is utilized in a recursive filter which leads to completely different results.

Obviously, the relative lengths of electrodes M' and M'1 and M''1, M'2 and M''2, and M'3 and M''3, which are respectively indicated in the following formulas by w, (1-w), w1, (1-w1), ..., w3, (1-w3), are variable from one pair to another.

Typically, such a use of a differential amplifier permits a definition of the numerator of the filter transfer function (in z-transform), that transfer function being possible stated as follows:

$$S = \frac{P(z)}{Q(z)} X \tag{14}$$

On the other hand, the hereabove mentioned formula (13) indicates that the structure of the bridge electrodes in the device shown in FIG. 11 enables a number of loops, that is four loops in the described embodiment, but that obviously may have a different value, in order to define the denominator Q(z) of the formula (14). By using the arrangement shown in FIG. 14, it is possible to define the numerator P(z). Thus it appears that the device according to this invention is of a very considerable importance regarding the filter techniques.

Next, to be described is how to use a device of the type shown in FIG. 14 in order to synthesize a 2-order high-pass elliptical filter having the following response:

$$S(z) = K\frac{1 - 2z^{-1}\cos\theta_o + z^{-2}}{1 + rz^{-1} + r^2 z^{-2}} \tag{15}$$

$$= K\frac{z^2 - 2z\cos\theta_o + 1}{z^2 = rz = r^2} \tag{16}$$

As already mentioned in the course of the calculations leading to equations (13), it is possible to design a device of the type shown in FIG. 11, wherein:

$$u1 = r^{\frac{1}{3}} \text{ and } u2 = v2 = u3 = v3 = 0$$

Such a device is shown in FIG. 16, wherein it will be particularly noted that barriers B2 and B3 are arranged as defined in the above relations.

It is still necessary to synthesize signal s(z) to generate a numerator n(z) such as:

$$n(z) = K(z-r)(z^2 - 2Z\cos\theta_o + 1) \tag{17}$$

to take into account the denominator resulting from the device and equal to $(z^3-r^3)$. Thus, the numerator n(z) may be written:

$$n(z)=K[z^3-z^2(r=2\cos\theta o)+z(2r\cos\theta o+1)-r] \quad (18)$$

That numerator is obtained by determining the lengths of the split memory electrodes, as follows, by assuming $h=K/(1-v1)$:

$$w=1-(h/2r^2)$$

with electrode M′ connected to the input − of differential amplifier AMP2 and M″ connected to its input +, $$w1=1-h/2(1-1/r^2)$$

with electrode M′1 connected to the input − and M″1 to input +.

$$w2=1-h/2(2r\cos\theta o+1)$$

with electrode M′2 connected to the input − and M″2 to input +

$$w3=1+h/2(r+2\cos\theta o)$$

with electrode M′3 connected to the input − and M″3 to input +.

It is convenient to select $v1=0$ and a maximum value for K in order to have the lengths between 0 and 1. Moreover, other connections are possible. For instance, the filter dynamic may be improved by connecting each electrode only to an input of an amplifier.

It will appear that, in the embodiment shown in FIG. 16, bridge electrodes W2 and W3 are no longer actual bridges since there are no more charge exchanges between lower and upper channel portions at several places. Thus, between G3 input and G14 output, there are six elementary delay stages which indeed correspond to three pairs of clock pulses, that is to a delay $z^3$.

Instead of substituting split memory electrodes for electrodes M, M1, M2 and M3, they can be substituted for electrodes N, N1, N2 and N3, as shown in FIG. 17.

With the same conventions as for the graph shown in FIG. 12, it comes:

$$Y1 = \bar{z} X (1 - v1) \frac{1}{z^3 - r^3}$$

$$Y2 = \bar{z} X (1 - v1) \frac{z^2}{z^3 - r^3}$$

$$Y3 = \bar{z} X (1 - v1) \frac{z}{z^3 - r^3}$$

$$\bar{z} Y = v1 X + (1 - u1) X1$$

Obviously, in that embodiment bridge electrodes W2 and W3 do not still operate as actual bridges.

Considering both the devices shown in FIGS. 14 and 16, it appears that they can be used to obtain two complementary filters.

FIG. 18 shows another possible embodiment of bridge electrodes which may be used instead of the barrier bridge electrodes shown in FIGS. 11, 14, 16 and 17. By way of example, the bridge electrode shown in FIG. 18 is assumed to be substituted for the bridge electrode W1 shown in FIG. 11.

Then, there is again, in FIG. 18, split electrode G2 which is connected to bus $\phi2$, split electrode G3 connected to bus $\phi1$, split electrode G14 connected to bus $\phi2$ and split electrode G15 connected to bus $\phi1$. Properly said, the bridge electrode is composed of three split electrodes WO.1 in the lower channel portion, WO.2 in the upper channel portion, and WO.3 crossing partially the upper and lower channel portions and entirely the mean channel portion.

The length of WO.1, considered in the transverse direction with respect to the channel, is assumed to be (1-r) and that of WO.2 to (1-s). As a result, at the time charges are passing from G2 to WO, a fraction (1-s) of those charges go to WO.1 and a fraction s thereof to WO.3.

Moreover, lengths of G3 and G15, which are independent of the lengths of G2 and G14, are selected so that the length of edge Q3 in front of WO.3 is equal to t and the length of edge Q15 in front of WO.3 is equal to (1-t). Calling p the product ts and q the product (1-t)r, outgoing charges $X_{G15}$ to G15 and $X_{G3}$ to G3 at clock time (T+1) are derived from charges $X_{G14}$ and $X_{G2}$ at clock time T, by:

$$X_{G15}(T+1)=(1-p)X_{G14}(T)+qX_{G2}(T)$$

$$X_{G3}(T+1)=pX_{G14}(T)+(1-q)X_{G2}(T)$$

p and q being distribution parameters (between 0 and 1) defined by the double split.

That system is similar to the system which may be written for the barrier bridge electrodes shown in FIG. 14, but it does not obtain any possible parameters (p.q).

Figure 13:
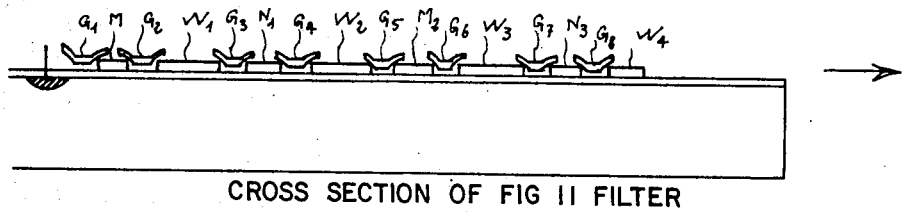
FIG. 13 is a schematic cross-section view of the charge transfer device shown in FIG. 11.

FIG. 13 shows a schematic cross-section of the device shown in FIG. 11, along the lower channel portion, which illustrates an example of a structure for such a device. It should be noted that, before split electrode G1, there is a supply electrode for applyng the signal to be filtered to the device. In FIG. 11, an output electrode is shown after electrode N. Those input and output electrodes are conventional, and are not shown in the last figures.

FIGS. 14, 16 and 17 show a possible connection arrangement for the split memory electrodes in conjunction with inputs + and − of a differential amplifier. However, obviously, it is possible for other connection arrangements to be used for non recursive filters. Thus, possibly, only an electrode element may be connected either to input + or − of the amplifier, depending on implementation of the weight sign.

We claim:

1. A charge transfer device ("CTD") recursive filter comprising a semiconductor substrate having a single channel formed thereon; means comprising at least two side-by-side CTD delay lines for respectively transferring charges in opposite directions along said channel; a plurality of split electrodes in a first of said CTD delay lines, each of which constitutes a pair with a corresponding one of a plurality of split electrodes in the other of said CTD delay lines; even bridge electrode means occupying the entire width of said channel and separating each even pair of split electrodes from the next odd pair of split electrodes; odd bridge electrode means occupying the entire width of said channel and separating each odd pair of split electrodes from the next even pair of split electrodes; each even-odd pair of said split electrodes having first and second delay lines, respectively, which together provide a constant delay period if said even-odd pair is separated by an even bridge electrode; each odd-even pair of said split electrodes having first and second delay lines, respectively, which together provide a constant delay period if said odd-even pair is separated by an odd bridge electrode; each of said delay lines having an input connected to receive signals to be filtered and having an output connected to deliver filtered signals, means for separately generating odd and even clock pulses; means responsive to each odd clock pulse at said odd bridge electrodes for distributing charges at said odd bridge electrodes to the closer even bridge electrodes in accordance with the lengths the split electrodes associated with the odd bridge electrode; and means responsive to each even clock pulse at said even bridge electrodes for distributing charges at said even bridge electrodes to the closer odd bridge electrodes in accordance with the lengths of the split electrodes associated with the even bridge electrodes.

2. The filter of claim 1 and means responsive to the same electrode potential for holding a lower level of charge under a bridge electrode than under the adjacent split electrodes, and means responsive to the application of an "on" potential to said electrodes for adjusting the charge level under split electrode to be lower than the charge level under a bridge electrode when an "off" potential is applied thereto.

3. The filter of claim 1 and means responsive to the same electrode potential for holding a higher level of charge under a bridge electrode than under the adjacent split electrodes, and means responsive to an application of an "on" potential to said electrodes for adjusting the charge level under the split electrode to be higher than the charge level under a bridge electrode when an "off" potential is applied thereto.

4. The filter of claim 1 and means responsive to an activation of a bridge electrode for transferring charges stored under its associated upstream electrode to its associated downstream electrode, with said transfer occurring in predetermined proportions.

5. The filter of anyone of the claims 1–4 and means for splitting the bridge electrodes between two side-by-side common channel delay lines in order to form memory electrodes, the bridge electrodes being split in the direction in which charges are transmitted through said delay lines.

6. The filter of claim 5 wherein said memory electrodes and the immediately preceding split electrodes have the same length.

7. The filter of claim 5 wherein said single channel comprises a plurality of said delay lines, means for diverting the direction of charge transfers from one delay line to an adjacent delay line, said bridge electrodes being located between selected adjacent delay lines at selected locations in said delay lines.

8. The filter of claim 6 wherein said single channel comprises a plurality of said delay lines, means for diverting the direction of charge transfers from one delay line to an adjacent delay line, said bridge electrodes being located between selected adjacent delay lines at selected locations in said delay lines.

9. The filter of claim 5 wherein the numbers of electrodes in adjacent delay lines may differ between any two successive bridge electrodes, said electrodes being divided into stages, each of said stages comprising an input electrode, a memory electrode and an output electrode, and memory electrode means for connecting each stage to the next stage in the downstream direction, said memory electrode being connected to a delay line bus which is common to a bridging electrode, said memory electrode being a non-bridging electrode which has a length that is less than the space between said delay lines.

10. The filter of claim 6 wherein the numbers of electrodes in adjacent delay lines may differ between any two successive bridge electrodes, said electrodes being divided into stages, each of said stages comprising an input electrode, a memory electrode and an output electrode, and memory electrode means for connecting each stage to the next stage in the downstream direction, said memory electrode being connected to a delay line bus which is common to a bridging electrode, said memory electrode being a non-bridging electrode which has a length that is less than the space between said delay lines.

11. The filter of claim 7 wherein the numbers of electrodes in adjacent delay lines may differ between any two successive bridge electrodes, said electrodes being divided into stages, each of said stages comprising an input electrode, a memory electrode and an output electrode, and memory electrode means for connecting each stage to the next stage in the downstream direction, said memory electrode being connected to a delay line bus which is common to a bridging electrode, said memory electrode being a non-bridging electrode which has a length that is less than the space between said delay lines.

12. The filter of claim 5 and exchange bridge electrode means divided into two sections, each of said sections feeding one of two output split electrodes, and means for causing predetermined fractions of charges to flow from two input split electrodes.

13. The filter of claim 6 and exchange bridge electrode means divided into two sections, each of said sections feeding one of two output split electrodes, and means for causing predetermined fractions of charges to flow from two input split electrodes.

14. The filter of claim 7 and exchange bridge electrode means divided into two sections, each of said sections feeding one of two output split electrodes, and means for causing predetermined fractions of charges to flow from two input split electrodes.

15. The filter of claim 8 and exchange bridge electrode means divided into two sections, each of said sections feeding one of two output split electrodes, and means for causing predetermined fractions of charges to flow from two input split electrodes.

16. The filter of claim 9 wherein said exchange bridge is divided into said two sections by an S-shaped barrier in said exchange bridge electrode, each end of the S-shaped barrier being in front of an output edge of an associated input electrode.

17. The filter of claim 9 wherein said bridge electrode is divided into three parts by splitting it twice in the same direction as the direction in which signals flow through said channel, each split being located within each channel area occupied by a delay line, the ends of the bridge electrode respectively transmit predetermined fractions of the charges from the associated input split electrodes to the output split electrode in the same delay line, the central portion of the bridge electrode actually exchanging charges between the two associated input split electrodes and the two associated output split electrodes, the charges from the two associated input split electrodes being reduced by said predetermined fractions.

18. The filter of claim 5 wherein one end of a pair of two delay lines includes an exchange bridge electrode, an input split electrode associated with said bridge electrode being in one delay line and an output split electrode associated with said bridge electrode being in the other delay line.

19. The filter of claim 6 wherein one end of a pair of two delay lines includes an exchange bridge electrode, an input split electrode associated with said bridge electrode being in one delay line and an output split electrode associated with said bridge electrode being in the other delay line.

20. The filter of claim 7 wherein one end of a pair of two delay lines includes an exchange bridge electrode, an input split electrode associated with said bridge electrode being in one delay line and an output split electrode associated with said bridge electrode being in the other delay line.

21. The filter of claim 9 wherein one end of a pair of two delay lines includes an exchange bridge electrode, an input split electrode associated with said bridge electrode being in one delay line and an output split electrode associated with said bridge electrode being in the other delay line.

22. The filter of claim 12 wherein one end of a pair of two delay lines includes an exchange bridge electrode, an input split electrode associated with said bridge electrode being in one delay line and an output split electrode associated with said bridge electrode being in the other delay line.

23. The filter of claim 16 wherein one end of a pair of two delay lines includes an exchange bridge electrode, an input split electrode associated with said bridge electrode being in one delay line and an output split electrode associated with said bridge electrode being in the other delay line.

24. The filter of claim 17 wherein one end of a pair of two delay lines includes an exchange bridge electrode, an input split electrode associated with said bridge electrode being in one delay line and an output split electrode associated with said bridge electrode being in the other delay line.

25. The filter of claim 5 and a plurality of memory electrodes within the channel area of each delay line, said memory electrodes extending in the same direction that signals progress through said channel, and differential circuit means having + and − inputs for delivering the algebraic difference between voltages applied from two sections, said memory electrodes being split with a first split section connected to said + input and a second split section connected to said − input.

26. The filter of claim 6 and a plurality of memory electrodes within the channel area of each delay line, said memory electrodes extending in the same direction that signals progress through said channel, and differential circuit means having + and − inputs for delivering the algebraic difference between voltages applied from two sections, said memory electrodes being split with a first split section connected to said + input and a second split section connected to said − input.

27. The filter of claim 7 and a plurality of memory electrodes within the channel area of each delay line, said memory electrodes extending in the same direction that signals progress through said channel, and differential circuit means having + and − inputs for delivering the algebraic difference between voltages applied from two sections, said memory electrodes being split with a first split section connected to said + input and a second split section connected to said − input.

28. The filter of claim 9 and a plurality of memory electrodes within the channel area of each delay line, said memory electrodes extending in the same direction that signals progress through said channel, and differential circuit means having + and − inputs for delivering the algebraic difference between voltages applied from two sections, said memory electrodes being split with a first split section connected to said + input and a second split section connected to said − input.

29. The filter of claim 12 and a plurality of memory electrodes within the channel area of each delay line, said memory electrodes extending in the same direction that signals progress through said channel, and differential circuit means having + and − inputs for delivering the algebraic difference between voltages applied from two sections, said memory electrodes being split with a first split section connected to said + input and a second split section connected to said − input.

30. The filter of claim 16 and a plurality of memory electrodes within the channel area of each delay line, said memory electrodes extending in the same direction that signals progress through said channel, and differential circuit means having + and − inputs for delivering the algebraic difference between voltages applied from two sections, said memory electrodes being split with a first split section connected to said + input and a second split section connected to said − input.

31. The filter of claim 17 and a plurality of memory electrodes within the channel area of each delay line, said memory electrodes extending in the same direction that signals progress through said channel, and differential circuit means having + and − inputs for delivering the algebraic difference between voltages applied from two sections, said memory electrodes being split with a first split section connected to said + input and a second split section connected to said − input.

32. The filter of claim 18 and a plurality of memory electrodes within the channel area of each delay line, said memory electrodes extending in the same direction that signals progress through said channel, and differential circuit means having + and − inputs for delivering the algebraic difference between voltages applied from two sections, said memory electrodes being split with a first split section connected to said + input and a second split section connected to said − input.

* * * * *

UNITED STATES PATENT AND TRADEMARK OFFICE
CERTIFICATE OF CORRECTION

PATENT NO. : 4,292,609
DATED : September 29, 1981
INVENTOR(S) : Feldman, et al.

It is certified that error appears in the above—identified patent and that said Letters Patent is hereby corrected as shown below:

Col. 5, Line 6, after "whose" insert --output--.

Col. 9, Line 16, "∅z" should be --∅2--.

Col. 9, Line 17, "bus ∅1" should be --bus ∅2--.

IN THE CLAIMS

Claim 15, Line 1, "claim 8" should be --claim 9--.

Claim 16, Line 1, "claim 9" should be --claim 12--.

Claim 17, Line 1, "claim 9" should be --claim 12--.

Signed and Sealed this

Eleventh Day of May 1982

[SEAL]

Attest:

Attesting Officer

GERALD J. MOSSINGHOFF

Commissioner of Patents and Trademarks